US006869499B2

(12) United States Patent
Toshima et al.

(10) Patent No.: US 6,869,499 B2
(45) Date of Patent: Mar. 22, 2005

(54) SUBSTRATE PROCESSING METHOD AND SUBSTRATE PROCESSING APPARATUS

(75) Inventors: Takayuki Toshima, Nirasaki (JP); Naoki Shindo, Nirasaki (JP); Tadashi Iino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 58 days.

(21) Appl. No.: 10/157,445

(22) Filed: May 28, 2002

(65) Prior Publication Data

US 2002/0185225 A1 Dec. 12, 2002

(30) Foreign Application Priority Data

May 28, 2001 (JP) ....................................... 2001-159359

(51) Int. Cl.[7] .......................... H01L 21/306; C23F 1/00

(52) U.S. Cl. ............................ 156/345.29; 156/345.33; 118/715

(58) Field of Search ................................ 118/715, 725; 156/345.29, 345.33

(56) References Cited

U.S. PATENT DOCUMENTS 5,250,323 A * 10/1993 Miyazaki ............... 427/255.39
5,616,208 A * 4/1997 Lee ....................... 156/345.24
5,683,516 A * 11/1997 DeDontney et al. ........ 118/718
5,710,079 A 1/1998 Sukharev .................... 438/778
5,727,578 A 3/1998 Matthews .................... 134/61
5,819,684 A * 10/1998 Hawkins et al. ............ 118/715
5,851,294 A * 12/1998 Young et al. .............. 118/715
5,911,837 A 6/1999 Matthews ...................... 134/2
5,967,156 A 10/1999 Rose et al. ..................... 134/7
6,030,460 A * 2/2000 Sukharev .................... 118/722
RE36,957 E * 11/2000 Brors et al. ................. 118/725
6,182,603 B1 * 2/2001 Shang et al. ......... 118/723 ME
6,267,125 B1 7/2001 Bergman et al. ............ 134/102
6,273,108 B1 8/2001 Bergman et al. ......... 134/102.1
6,349,669 B1 * 2/2002 Matsumura et al. .. 118/723 HC
6,383,300 B1 * 5/2002 Saito et al. ................. 118/715
6,444,037 B1 * 9/2002 Frankel et al. .............. 118/715
6,503,330 B1 * 1/2003 Sneh et al. ................. 118/715
6,688,020 B2 * 2/2004 Toshima et al. .............. 34/573
6,729,041 B2 * 5/2004 Shindo et al. ................ 34/444
2001/0032396 A1 * 10/2001 Toshima et al. .............. 34/444
2002/0045008 A1 * 4/2002 Toshima et al. ......... 427/248.1
2002/0132480 A1 * 9/2002 Shindo et al. .............. 438/689
2002/0185225 A1 * 12/2002 Toshima et al. ....... 156/345.33
2004/0063319 A1 * 4/2004 Toshima et al. ............ 438/689
2004/0069226 A1 * 4/2004 Yoshida et al. ............. 118/715

* cited by examiner

*Primary Examiner*—Jeffrie R. Lund
(74) *Attorney, Agent, or Firm*—Morrison & Foerster LLP

(57) ABSTRACT

After semiconductor wafers W have been processed with ozone gas and steam fed into a processing vessel 10, air is fed into the processing vessel 10 from an air supply source connected to an ozone gas supply pipe 42 for feeding ozone gas into the processing vessel 10, whereby an atmosphere of the ozone gas in the processing vessel 10 is replaced with an atmosphere of the air.

13 Claims, 12 Drawing Sheets

SUBSTRATE PROCESSING METHOD AND SUBSTRATE PROCESSING APPARATUS

BACKGROUND OF THE INVENTION

1. Field of the Invention

The present invention relates to a technique of processing substrates, such as semiconductor wafers and glass LCD substrates, in processing vessels by using a processing gas, such as ozone gas, more specifically, a technique of purging the interior of the processing vessel after the processing with the processing gas has been completed.

2. Description of the Related Art

Fabrication processes for semiconductor devices include the step of applying a photoresist to a semiconductor wafer, the step of transferring a circuit pattern to a photoresist by photolithography process, the step of developing the photoresist and the step of removing the photoresist from the wafer.

Generally, the resist removing step is performed by dipping wafers in a cleaning tank filled with a chemical liquid called SPM (mixed liquid of $H_2SO_4/H_2O_2$).

However, from the ecological viewpoint, recently the resist removal using ozone aqueous solution whose waste liquid treatment is easy has become prevalent. In this resist removal, wafers are dipped in a cleaning tank filled with ozone aqueous solution to oxidize the resist with radicals of oxygen atoms in the aqueous solution so as to decompose the resist into carbon dioxide, water, etc. In the conventional method for such resist removal, a high concentration of ozone gas is bubbled in pure water to produce ozone aqueous solution, the ozone aqueous solution is fed into the cleaning tank through a piping. However, this method has a disadvantage that while ozone aqueous solution is being fed to the cleaning tank and also during a time from the load of the ozone aqueous solution to the start of the processing, the ozone concentration in the aqueous solution is decreased. Ozone (radicals) of the ozone aqueous solution present in the vicinity of the wafers react with the resist to be extinguished, but the supplementation of ozone is not quickly performed. As a result, a sufficient amount of ozone cannot be fed to the resist surface, and accordingly the reaction speed is not high.

Then, as an innovational substitute of the above-described dip cleaning, a cleaning method using ozone gas and steam has been proposed. This cleaning method includes the following steps (1) to (5) which are sequentially performed: (1) a step of feeding hot air into a processing vessel to raise the wafer temperature; (2) a pre-pressuring step of feeding ozone gas (or ozone gas and steam) to pre-pressurize the interior of the processing vessel; (3) an $O_3$/steam processing step of feeding ozone gas and steam into the processing vessel to process the wafers; (4) an $O_2$ purging step of purging the interior of an ozone gas feed pipe with oxygen gas; and (5) an air purging step of feeding cool air into the processing vessel to purge the interior of the processing vessel with the cool air.

In the $O_2$ purging step, oxygen gas, which is a raw material gas of ozone gas, is introduced into an ozone gas generator with the ozone gas generator being stopped. The interior of the ozone gas generator and the interior of the pipe between the ozone gas generator and the processing vessel are purged with the oxygen gas. Accordingly, the $O_2$ purging step takes a considerably long time. Furthermore, in the air purging step, ozone stagnates and resides at areas located outside of the main stream of the air formed by jetting the cool air. This disadvantageously reduces the effect of the purging step. Consequently, the throughput of the apparatus is low.

SUMMARY OF THE INVENTION

Therefore, the object of the present invention is to provide a method and an apparatus which can improve the purging efficiency of purging the interiors of the processing gas feed pipe and the processing vessel.

To achieve the objective, the present invention provides a substrate processing method, which includes the steps of: loading a substrate into a processing vessel; feeding a processing gas into the processing vessel from a processing gas supply source through a processing gas supplying path while feeding a vapor into the processing vessel, thereby processing the substrate with the processing gas and the vapor; and feeding, after the substrates have been processed with the processing gas and the vapor, air into the processing vessel by introducing the air to the processing gas supplying path at a position between the processing gas supply source and the processing vessel, thereby purging the processing vessel with the air.

The present invention further provides a substrate processing method, which includes the steps of: loading a substrate into a processing vessel; feeding a processing gas and a vapor into the processing vessel to process the substrate with the processing gas and the vapor; and feeding, after the substrate has been processed with the processing gas and the vapor, air into the processing vessel, thereby purging the processing vessel with the air, wherein the air feeding step includes: feeding the air into the processing vessel at a first flow rate; feeding the air into the processing vessel at a second flow rate less than the first flow rate; and repeating the step of feeding the air at the first flow rate and the step of feeding the air at the second flow rate.

The present invention further provides a substrate processing method, which includes the steps of: loading a substrate into a processing vessel; feeding a processing gas and a vapor into the processing vessel to process the substrate with the processing gas and the vapor; and feeding, after the substrate has been processed with the processing gas and the vapor, air and the vapor into the processing vessel, thereby purging the processing vessel with the air and the vapor, wherein the step of feeding the air and the vapor includes: feeding the air and the vapor into the processing vessel at a first flow rate; feeding the air and the vapor into the processing vessel at a second flow rate less than the first flow rate; and repeating the step of feeding the air and the vapor at the first flow rate and the step of feeding the air and the vapor at the second flow rate.

The second flow rate may be naught (zero). In this case, the step of feeding the air (or the air and the vapor) into the processing vessel at the second flow rate is equivalent to a step of stopping feeding the air (or the air and the vapor).

The processing gas may be a gas which reacts with the vapor to produce radicals. The processing gas may be ozone gas, chlorine gas or fluorine gas, for example. The processing gas may be chlorine gas, fluorine gas, hydrogen gas or the like, which includes radicals before reacting with the vapor.

The vapor is preferably made by vaporizing a liquid that dissolves the processing gas to produce radicals derived from the processing gas. The vapor is preferably steam of pure water.

The substrates to be processed may be semiconductor wafers, LCD substrates or the like.

According to the second aspect of the present invention, a substrate processing apparatus is provided, which includes: a processing vessel; a processing gas supplying path, through which a processing gas is fed to the processing vessel; a vapor supplying path, through which a vapor is fed to the processing vessel; an air supplying path connected to the processing gas supplying path to feed air into the processing vessel through the processing gas supplying path; and at least one first valve adapted to change gas-feeding condition between a first state in which only the processing gas is fed to the processing vessel and a second state in which only the air is fed to the processing vessel.

DESCRIPTION OF THE PREFERRED EMBODIMENTS

Figure 1:
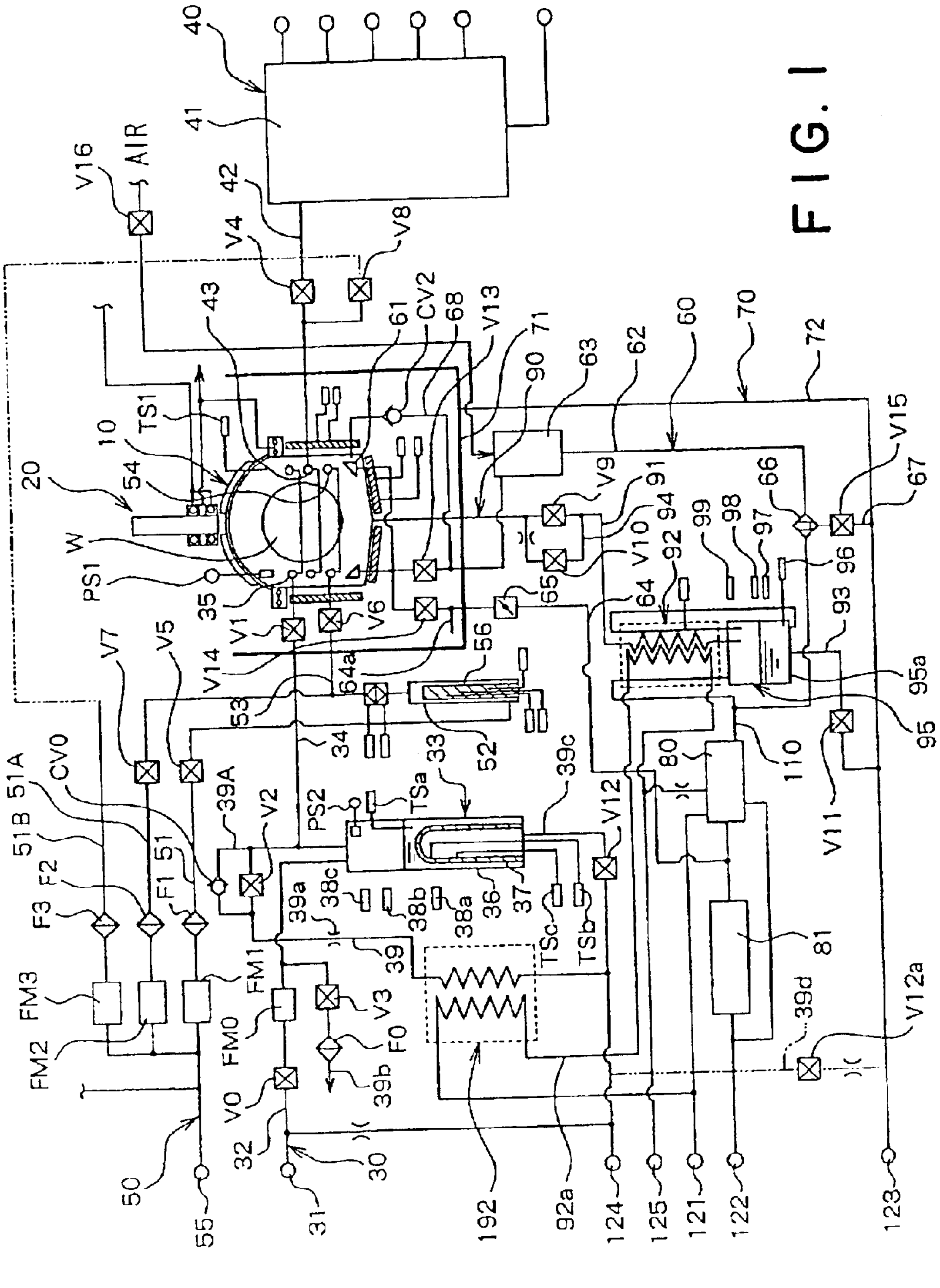
FIG. 1 is a system diagram of an embodiment of the substrate processing apparatus according to the present invention.

An embodiment of the present invention will be described with reference to the drawings. In the present embodiment, a resist is removed from semiconductor wafers W by using ozone gas and steam.

A substrate processing apparatus is equipped with: a processing vessel 10; a wafer guide 20 for holding wafers W in the processing vessel 10; a steam supply system 30 (i.e., a solvent-vapor supply system) for supplying steam into the processing vessel 10; an ozone gas supply system 40 (i.e., processing gas supply system) for supplying ozone gas into the processing vessel 10; an air supply system 50 for supplying air into the processing vessel 10; an exhaust system 60 for exhausting the interior of the processing vessel 10; a diffusion preventing means 70 for preventing the diffusion of ozone gas or toxic gas around the processing vessel 10; an ozone killer 80 (i.e., ozone treating device) for decomposing ozone included in the exhaust gas discharged from the processing vessel 10; and a drain system 90 for draining the condensed liquid from the interior of the processing vessel 10. The drain system 90 is used as a second exhaust system for exhausting the interior of the processing vessel 10.

The processing vessel 10 includes a vessel body 11 having a volume allowing for a plurality of wafers W, for example fifty wafers, and a vessel cover 12 for opening and closing a loading/unloading opening 14 formed in the upper end of the vessel body 11.

The vessel cover 12 can be moved up and down by a lift mechanism 15. The lift mechanism 15 is operated in response to a control signal from a controller, for example a central processing unit 100 (hereinafter called a CPU 100) to open or close the vessel cover 12. When the vessel cover 12 is lifted, the loading/unloading opening 14 is opened to admit wafers W into the vessel body 11. After the wafers W have been loaded in the vessel body 11, the vessel cover 12 is lowered to close the loading/unloading opening 14. At this time, a gap between a flange la on the upper end of the vessel body 11 and a flange 12*a* on the lower end of the vessel cover 12 is tightly closed by a hollow sealing member 16 which is inflatable by injection of air. The interior of the processing vessel 10 is a tightly closed space, from which no gas leaks outside. A locking mechanism (not shown) for keeping the vessel cover closed is provided on the upper end of the vessel body 11.

A rubber heater 17 is mounted on the outer peripheral surface of the vessel body 11. Rubber heaters 18 and 19 are mounted on the outer peripheral surface of the vessel cover 12 and the outer peripheral surface of the vessel body 11. These rubber heaters 17, 18 and 19 are connected to an electric power source (not shown) and generate heat to maintain an internal atmosphere of the processing vessel 10 at a prescribed temperature (in a range of, e.g., 80–120° C.). The CPU 100 controls calories of the rubber heaters 17, 18 and 19, based on a temperature of the interior of the processing vessel 10 detected by a temperature sensor TS1 so as to maintain an internal atmosphere of the processing vessel 10 at the above-mentioned prescribed temperature. The rubber heaters 17, 18 and 19 also play the role of preventing dewing (condensation of steam) in the processing vessel 10.

A steam supply system 30 includes: a pure water supply pipe 32 connected to a pure water source 31; a steam generator 33 which evaporates pure water supplied through the pure water supply pipe 32 to generate steam; a steam supply pipe 34 which supplies the steam in the steam generator 33; and a pair of steam nozzles 35 which inject into the processing vessel 10 the steam supplied through the steam supply pipe 34.

The pure water supply pipe 32 has one end connected to the pure water source 31. An open-close valve V0 and a flow rate controller FM0 are inserted in the pure water supply pipe 32 sequentially from the side of the pure water source 31. The open-close valve V0 and the flow rate controller FM0 are controlled based on a control signal from the CPU 100. The open-close valve V0 is controlled between the full-open state and the full-closed state, and an opening of the flow rate controller FM0 is controlled to control the flow rate of the pure water.

Figure 3:
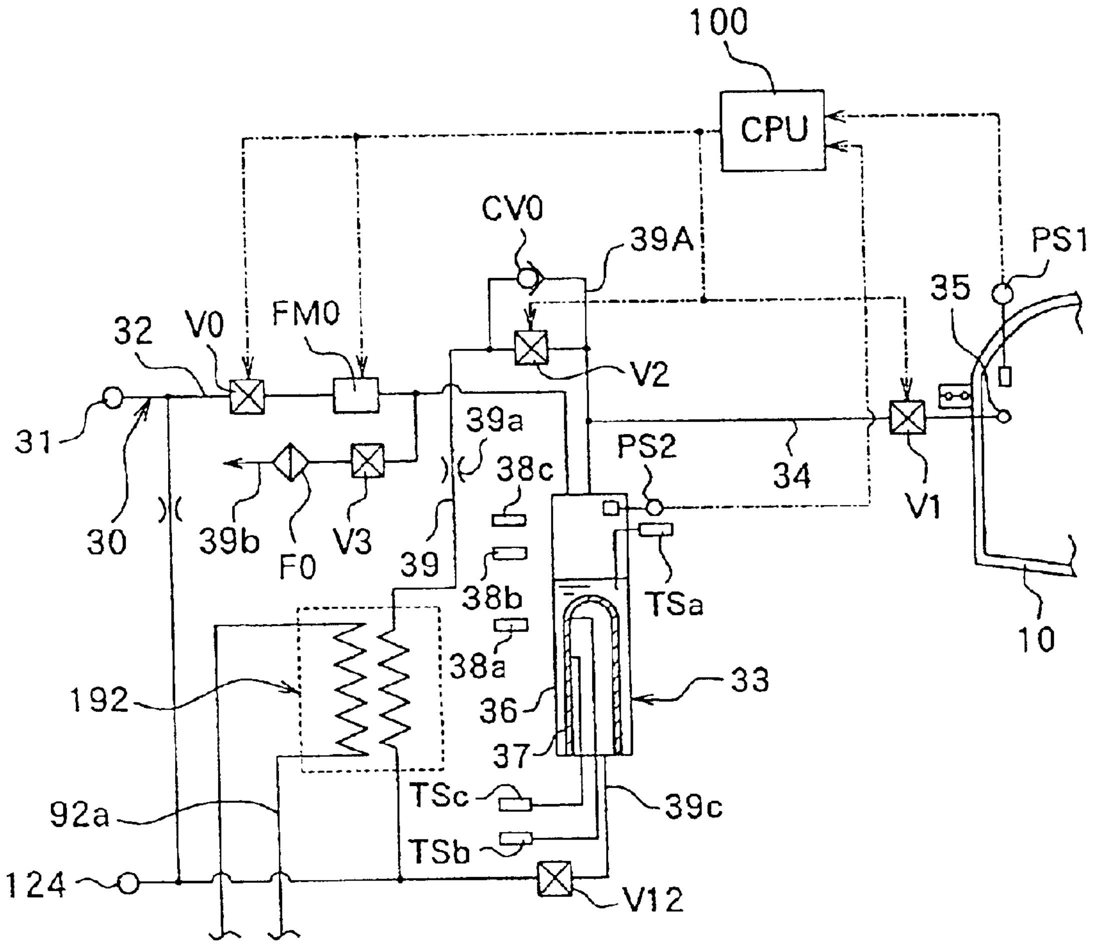
FIG. 3 is an enlarged view showing the steam generator and the relevant parts shown in FIG. 1.
Figure 4:
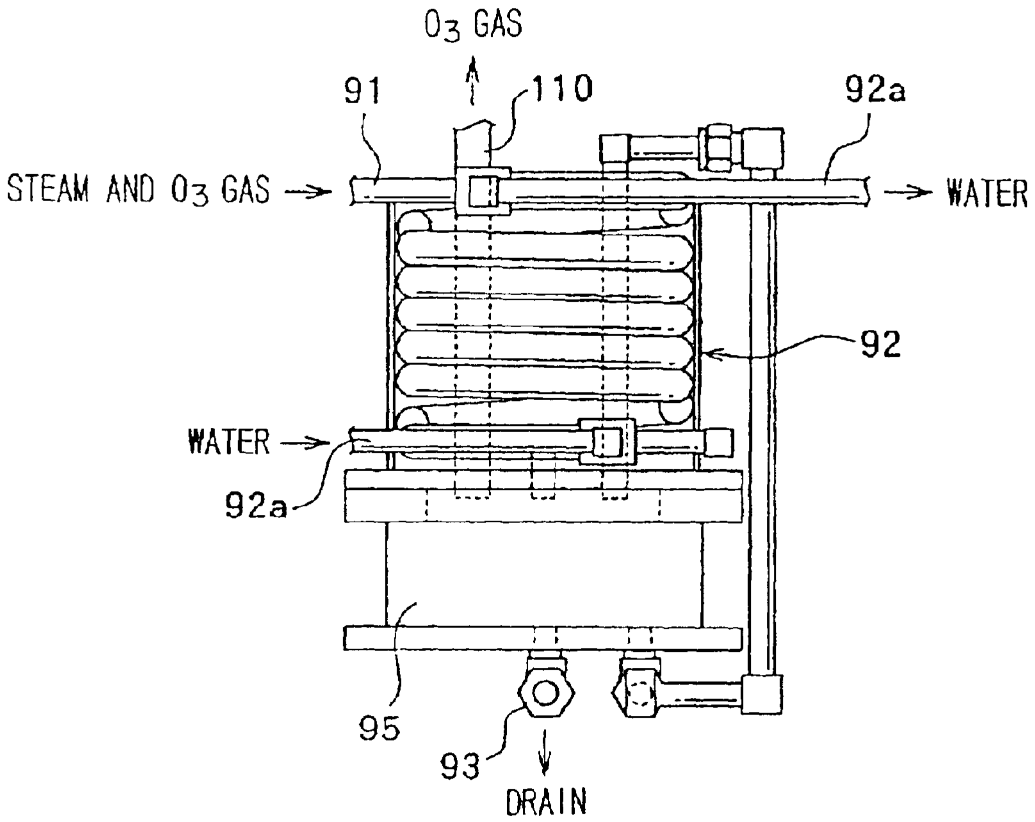
FIG. 4 is a side view of the condenser shown in FIG. 1.
Figure 5:
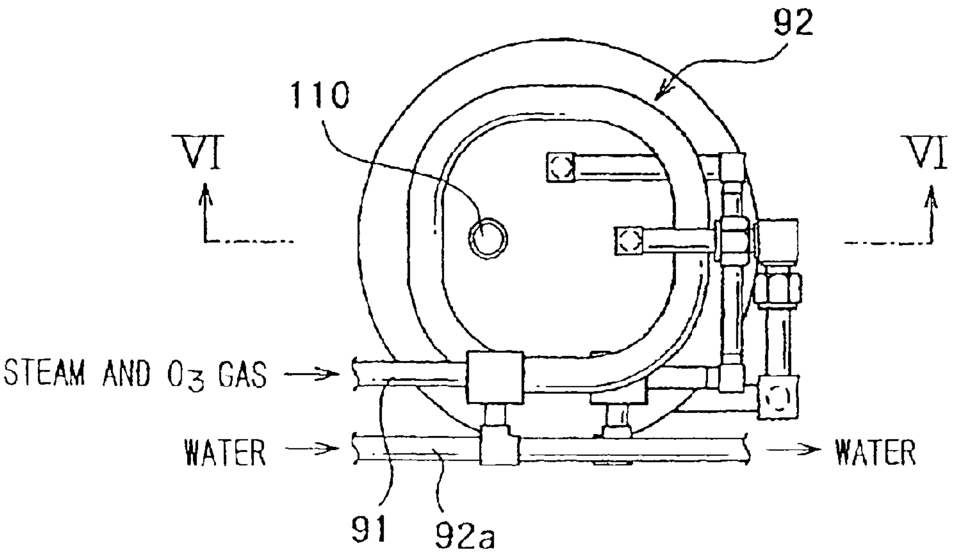
FIG. 5 is a plan view of the condenser shown in FIG. 4.

As shown in FIG. 3, the steam generator 33 includes: a tightly-closed tank which is a vessel for supplying the pure water; a heater 37 vertically extending at the center of the interior of the tank 36; a pressure sensor PS2 which detects a pressure of the steam in the tank 36; and three water-level sensors 38*a*, 38*b* and 38*c* which detect a water level of the pure water in the tank 36. In the steam generator 33, a calorie of the heater 37 (the amount of heat generated by the heater 37) is adjusted in accordance with a contact area between the pure water in the tank 36 and the heater 37, whereby an amount of steam generated in the tank 36 is adjusted to a required amount. The sensors 38*a* thru 38*c* are connected to the CPU 100. When a water level in the tank 36 is lowered and is detected by the sensor 38*a*, the CPU 100 opens the open-close valve V0 to start the supplementation of the pure water into the tank 36. When the water level is raised and is detected by the sensor 38*b*, the CPU 100 closes the open-close valve V0 to stop the supplementation of the pure water into the tank 36. Accordingly, an amount of the pure water in the tank 36 is maintained in a prescribed range. The sensor 38*c* detects an abnormality that the tank is entirely filled with the pure water. In such abnormality, the CPU 100 turns on an alarm, not shown.

The steam generator 33 has a first temperature sensor TSa that detects a water temperature in the tank, a second temperature sensor TSb that detects a temperature the heater 37 for adjusting the temperature of the heater 37, and a third temperature sensor TSc that detects an excessive temperature rise of the heater 37. The steam generator 33 has a pressure sensor PS2 that detects a pressure of the generated steam in the tank 36. The CPU 100 can monitor a state of the steam generator 33 based on detection signals from the first thru the third temperature sensors TSa-TSc and the pressure sensor PS2.

A first open-close valve V1 is inserted in the steam supply pipe 34 interconnecting the steam generator 33 and the steam nozzle 35. A drainpipe 39 connected to a condenser 192 (which will be described later) is branched from the steam supply pipe 34 upstream (nearer the tank 36) of the first open-close valve V1. A second open-close valve V2 is inserted in the drain pipe 39. A bypass pipe 39A bypassing the second open-close valve V2 is inserted in the drain pipe 39. A relief valve CV0, which prevents a pressure in the steam generator 33 from exceeding a prescribed value (a pressure resistance value of the tank 36 or critical pressure resistance values of the valves V1, V2, V3, etc.), is inserted in the bypass pipe 39A. An orifice 39*a*, which prevents a pressure in the steam generator 33 from abruptly lowering, is inserted in the drain pipe 39 downstream of the second open-close valve V2 and the relief valve CV0 and upstream of the condenser 192.

Air intake pipe 39*b* opened to the atmosphere is connected to the pure water supply pipe 32, in which the valve V3 and a filter F0 is inserted. Air is introduced into the steam generator 33 via the air intake pipe 39*b*, when water in the steam generator 33 is drained. The above-described constitution makes it possible to supply steam of a pressure which is above a pressure in the processing vessel 10.

The first and the second open-close valves V1 and V2 are opened and closed by control signals from the CPU 100. When steam is fed into the processing vessel 10, the valve V1 is opened and the valve V2 is closed. In view of improvement of throughput, the heater 37 of the steam generator 33 is always energized to generate steam. Thus, when steam is not fed to the processing vessel 10 and thus the valve V1 is closed, the open-close valve V2 is opened or closed to maintain pressure in the steam generator 33 within a prescribed range.

Steam having been passed through the relief valve CV0 and steam having been passed through the second open-close valve V2, when a pressure in the steam generator 33 has been adjusted, is led to the condenser 192 via the drain pipe 39. The steam is condensed while it is passing through the condenser 192. The condensed water is directed to a pure water drain system 142 through the pure water drain pipe 39*c* to be re-used.

Pure water drained from the steam generator 33 is directed to the pure water drain system 124 through the pure water drain pipe 39*c* with the open-close valve V12 inserted in to be re-used. Alternatively, pure water drained from the steam generator 33 may be drained to a drain system 123 exclusive for plant acid liquids, which will be described later, through the pure water drain pipe 39*d* branched from the pure water drain pipe 39*c*. The open-close valve V12, and the open-close valve V12*a* inserted in the pure water drain pipe 39*d* are opened and closed in response to control signals from the CPU 100. Thus, acid drain liquids can be diluted as required.

Figure 13:
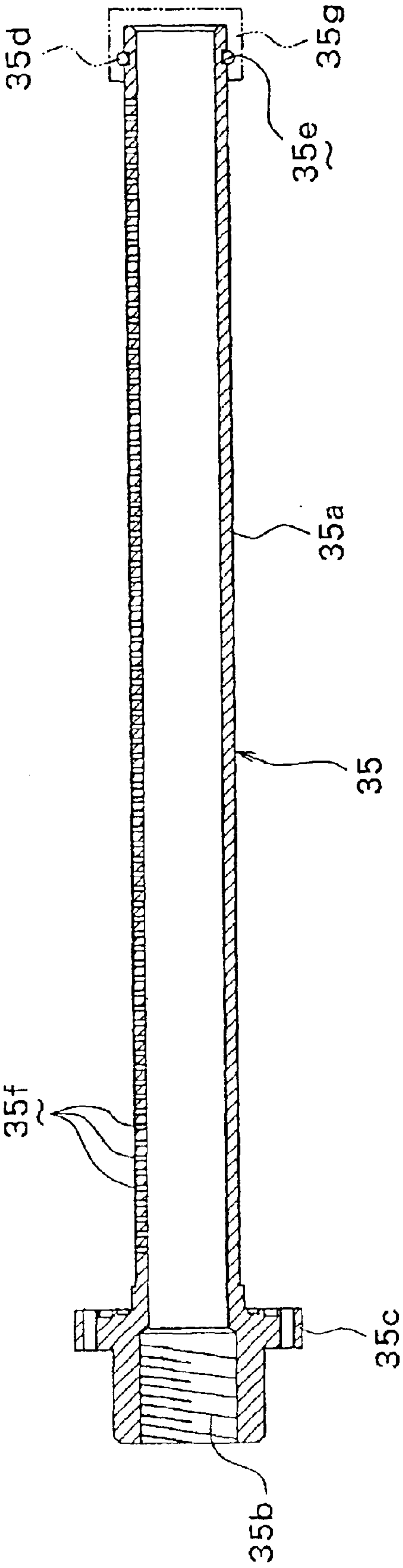
FIG. 13 is a cross-sectional view of the steam nozzle.

As shown in FIG. 13, the steam nozzle 35 has a pipe-shaped nozzle body 35*a*. The nozzle body 35*a* has a female thread 35*b* and an application flange 35*c* provided on the proximal end. Provided on the outer circumferential surface of a distal end portion of the nozzle body 35*a* is a groove 35*e*, in which an O-ring 35*d* is fitted. A number of nozzle ports 35*f* are formed linearly at intervals in the nozzle body 35. A cap 35*g* is fitted on the nozzle body 35*a* via the O-ring 35*d* to close the distal end opening of the nozzle body 35*a*.

Each of the steam nozzles 35 is secured to the vessel body 11 of the processing vessel 10 so that the longitudinal axis of the nozzle 35 extends horizontally, by using an application screw (not shown) passed through the flange 35*c*.

Figure 2:
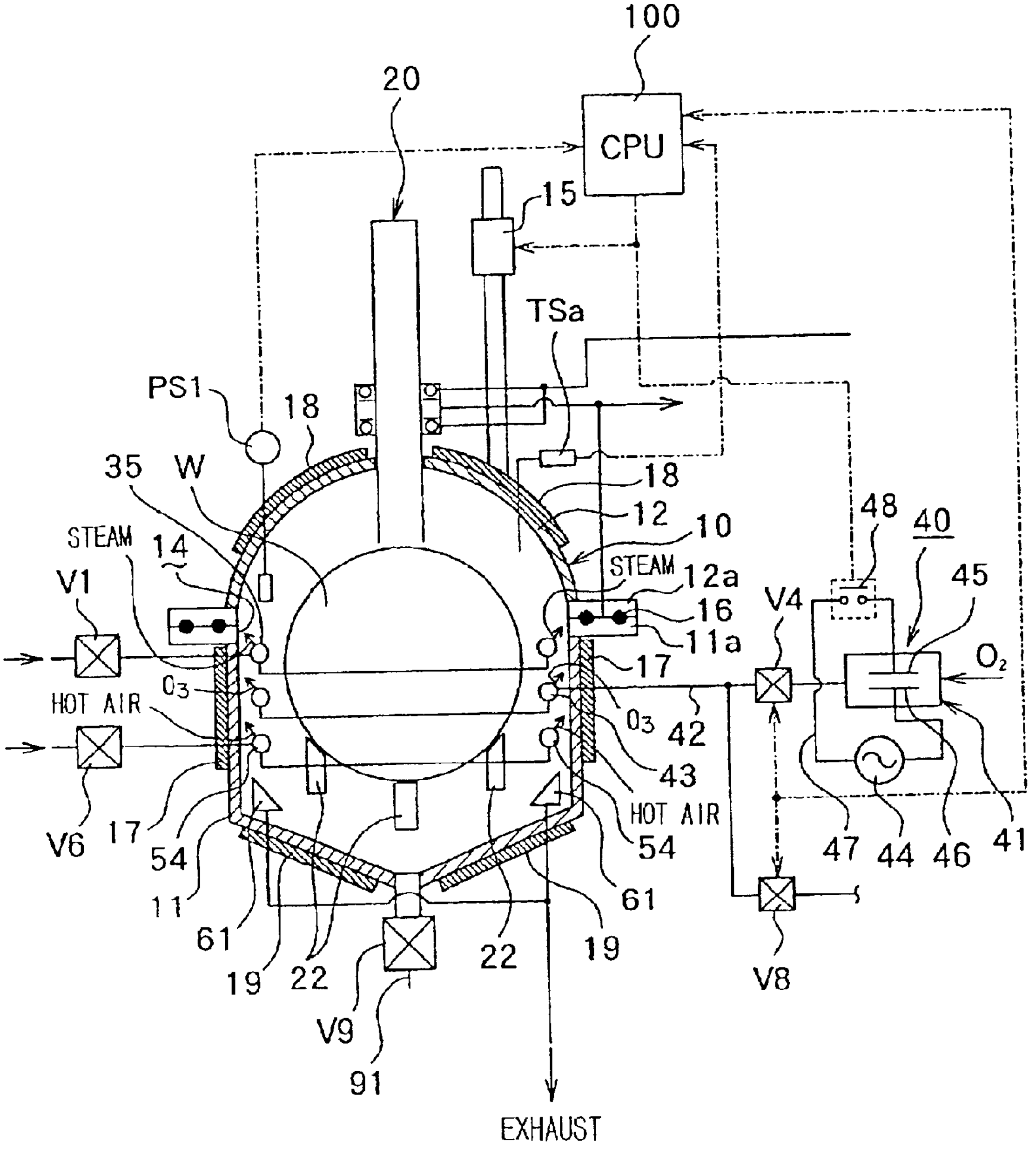
FIG. 2 is an enlarged view showing the processing vessel and the relevant parts shown in FIG. 1.

The axial lines of the nozzle ports 35*f* are directed toward the inside wall surface of the processing vessel 10 and obliquely upward (suitably, tilted by 45° to the horizontal plane) (see FIG. 2). The nozzle ports 35*f* are directed toward the inside wall surface of the processing vessel 10 so as to prevent the steam from being blown directly onto the wafers W, which would result in the formation of liquid drops on the wafers W.

The nozzle ports 35*f* are tilted toward the inside wall surface and obliquely upward (see FIG. 2), so that the steam rises along the inside wall of the processing vessel to be mixed at an upper part of the interior of the processing vessel with ozone gas injected from ozone gas nozzles 43 which will be described later, and the mixed gas is fed to the wafers W in a downward stream.

The ozone gas supply system 40 includes: an ozone gas generator 41; an ozone gas supply pipe 42 (i.e., a processing gas supply pipe) connected to the ozone gas generator 41; and a pair of zone gas nozzles 43 which inject ozone gas supplied through the ozone gas supply pipe 42 onto both sides of the wafers W in the processing vessel 10.

As shown in FIG. 2, the ozone gas generator 41 passes oxygen ($O_2$), which is a raw material gas of ozone gas, between a discharge electrodes 45 and 46, to which a high-frequency voltage applied by a high-frequency power source 4, whereby ozone ($O_3$) gas is generated.

A switch 48 is inserted in an electric circuit 47 connecting the discharge electrodes 45 and 46 to the high-frequency power source 44. The switch 48 is opened and closed, based on control signals from the CPU 100.

An open-close valve V4 is inserted in the ozone gas supply pipe 42. The secondary side (the side of the processing vessel 10) of the open-close valve V4 is connected to an air supply pipe 51B connected to an air supply source 55. An open-close valve V8 is inserted in the air supply pipe 51B. The open-close valves V4 and V5 are opened and closed in response to control signals from the CPU 100. When the ozone gas is supplied into the processing vessel 10, the open-close valve V4 is opened while the open-close valve V8 is closed. When air is supplied into the processing vessel 10, the open-close valve V4 is closed while the open-close valve V8 is opened. When the supply of the ozone gas and air is stopped, both the open-close valves V4 and V8 are closed. In place of the open-close valves V4 and V8, a three-way valve may be placed in the ozone gas supply pipe 42 at a position where the air supply pipe 51B is connected thereto.

Figure 14:
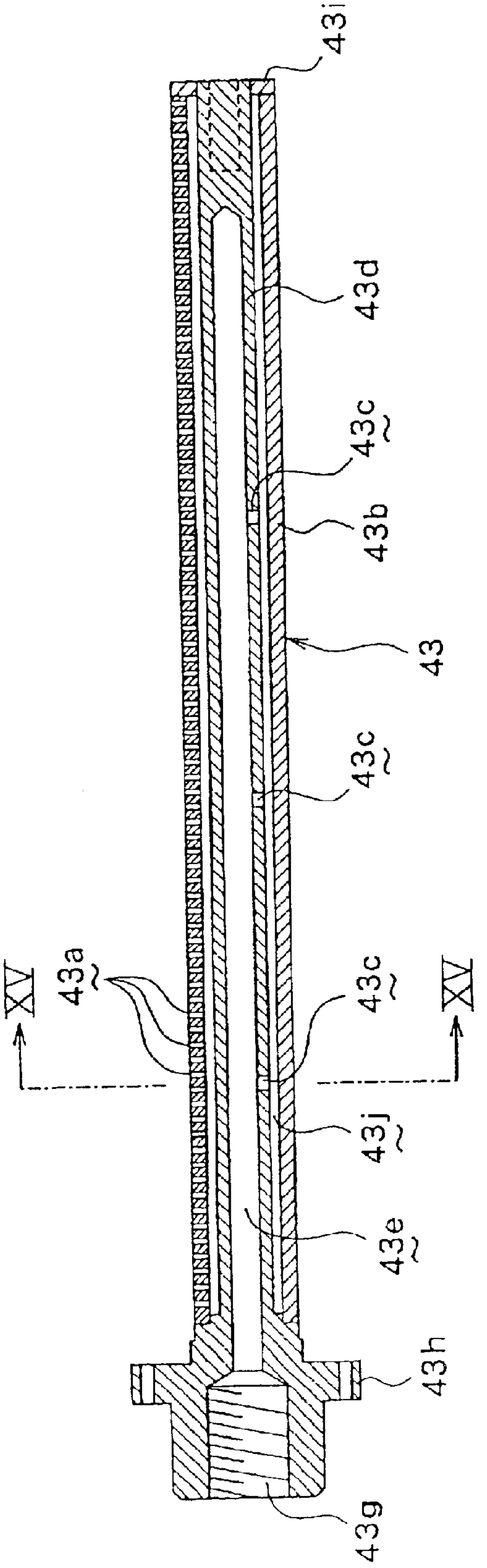
FIG. 14 is a cross-sectional view of the ozone gas nozzle.
Figure 15:
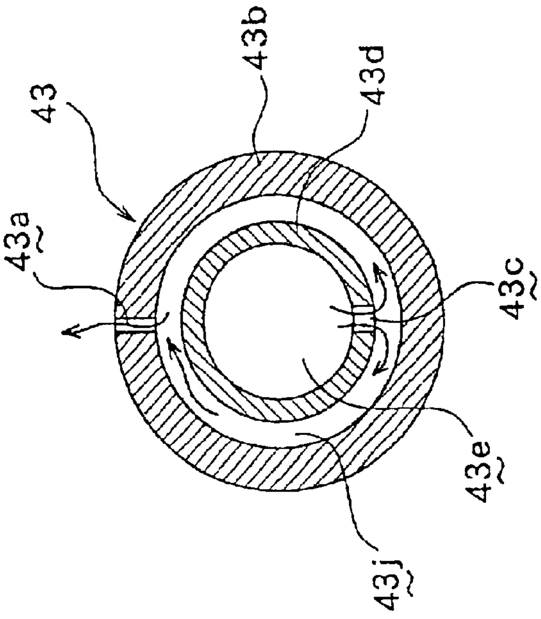
FIG. 15 is an enlarged cross-sectional view of the ozone gas nozzle taken along the line XV—XV in FIG. 14.

As shown in FIGS. 14 and 15, the ozone gas nozzle 43 comprises an outer pipe 43*b* having a number of ozone injection ports 43*a* provided linearly at intervals, and an inner pipe 43*d* having a plurality (e.g., three) of communication holes 43*c* provided therein. The inner pipe 43*d* is inserted in the outer pipe 43*b* with a gap being defined therebetween. An ozone gas passage 43*e* having a closed distal end is formed in the inner pipe 43*d*. A female thread 43*g* and an application flange 43*h* are provided on the proximal portion of the inner pipe 43*d* for connecting the ozone nozzle 43 to the ozone gas supply pipe 42. A closing plate 43*i* for closing the gap between the inner pipe 43*d* and the outer pipe 43*b* is mounted on the distal end of the inner pipe 43*d*. The inner pipe 43*d* is fixedly inserted in the outer pipe 43*b* so that the ozone injection ports 43*a* are located opposite the communication ports 43*c*.

Each of the ozone gas nozzles 43 is secured to the vessel body 11 of the processing vessel 10 by means of an application screw (not shown) passed through the application flanges 43, with the longitudinal axis of the nozzle 43 extending horizontally. The axial lines of the ozone injection ports 43*a* are directed toward the inside wall surface of the processing vessel 10 and obliquely upward (suitably, tilted by 45° to the horizontal surface) (see FIG. 2), in order to prevent the ozone gas from being injected directly onto the surfaces of the wafers W.

Since the communication ports 43*c* are located opposite the ozone injection ports 42*a*, the ozone gas can be uniformly injected through the respective ozone gas injection ports 43*a*. The ozone gas introduced into the ozone gas passages 43*e* flows through the communication ports 43*a* into the gap 43*j* between the outer pipe 43*b* and the inner pipe 43*d* to be dispersed in the gap 43*j*, and is led into the ozone injection ports 43*a*, whereby the ozone gas can be uniformly supplied into the respective ozone injection ports 43*a*.

The air supply system 50 includes a first sub-system (heating air supply system) for supplying air for raising temperature of the wafers W, and a second sub-system (purge-air supply system) for supplying air for purging the interior of the processing vessel 10.

The heating air supply system comprises a first air supply pipe 51, a hot air generator 52, a second air supply pipe 53 and a pair of air nozzles 54. Air is supplied to the hot air generator 52 from the air supply source 55 through the first air supply pipe 51, and the heated air is supplied to the pair of air nozzles 54 through the second air supply pipe 53 to be fed into the processing vessel 10.

The purge-air supply system comprises a purge-air supply pipe 51A connected to the first air supply pipe 51 and the second air supply pipe 53, and a purge-air supply pipe 51B connected to the first air supply pipe 51 and the ozone gas supply pipe 42.

The first air supply pipe 51 has one end connected to an air supply source 55. A flow rate controller FM1, a filter F1 and an open-close valve V5 are inserted in the first air supply pipe 51 from the side of the air supply source 55. The flow rate controller FM1 and the filter F1 are operated in response to control signals from the CPU 100 to control the air supply/air supply stop, and the air flow rate. A heater 56 is disposed in the hot air generator 52. An open-close valve V6 is inserted in the second air supply pipe 53. The operation of the open-close valve V6 is controlled by the CPU 100.

A flow rate controller FM2, a filter F2 and an open-close valve V7 are inserted in the purge-air supply pipe 51*a* from the side of the air supply source 55. A flow rate controller FM3, a filter F3 and an open-close valve V8 are inserted in the purge-air supply pipe 51B from the side of the air supply source 55. The open-close valves V7 and V8 and the flow rate controllers FM2 and FM3 are operated based on control signals from the CPU 100 to control the air supply/air supply stop and the flow rates of air. When the interior of the processing vessel 10 is purged with an ejector 63 (which will be described later) being operated, since the drain flow rate of the ejector 63 is fixed, the flow rate of purge-air fed into the processing vessel 10 from the air supply pipe 51B is controlled so as to correspond to the drain flow rate of the ejector 63.

Figure 16:
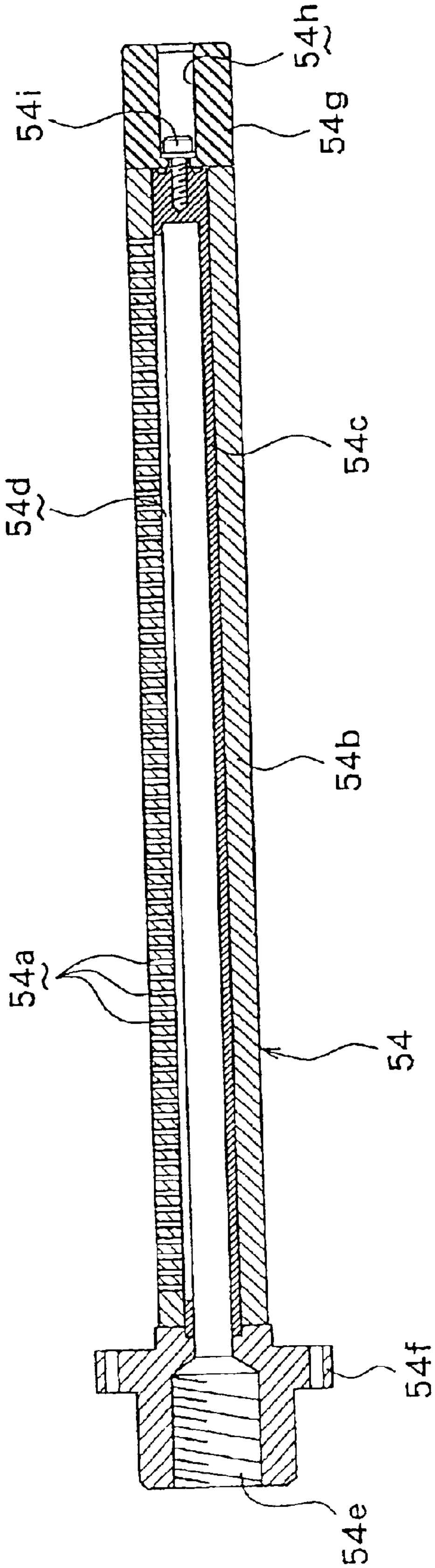
FIG. 16 is a cross-sectional view of the air nozzle.

As shown in FIG. 16, each of the air nozzles 54 comprises an outer pipe 54*b* having a number of air injection ports 54*a* arranged linearly at intervals, and an inner pipe 54*c* inserted in the outer pipe 54*b* with a gap defined therebetween. The inner pipe 54*c* has a slit 54*d* facing the air injection ports 54*a* of the outer pipe 54*b*.

Extending beyond the proximal end of the outer pipe 54*b* is the proximal end of the inner pipe 54*c*, which is provided with a female thread 54*e* and an application flange 54*f* for connecting the air nozzle 54 to the second air supply pipe 53. Each of the air nozzles 54 has a securing member 54*g* for securing the air nozzle 54 to the side wall of the vessel body 11 of the processing vessel 10. The securing member 54*g* is connected to the distal end of the inner pipe 54*c* by an interconnection screw 54*i* put in a through-hole 54*h* formed in the securing member 54*g*.

Each of the air nozzles 54 are secured to the vessel body 11 of the processing vessel 10 so that the longitudinal axes of the nozzles 54 extends horizontally, by using application screws (not shown) put through the application flange 54*f*. The air nozzles 54 are arranged on both sides of the wafers W loaded in the processing vessel 10 at a height corresponding to the lower end of the wafers W.

The interconnection screw 54*i* is adjusted so that the axial lines of the air injection ports 54*a* are directed toward the inside wall surface of the processing vessel 10 and obliquely upward (suitably, titled by about 45° to the horizontal surface) (see FIG. 2), in order to prevent the air from being injected directly onto the surfaces of the wafers W.

As described above, the drain system 90 not only drains liquids in the processing vessel 10, specifically water, which is the condensed steam, but also functions as a second exhaust system. The drain system 90 includes a first drain pipe 91 connected to the bottom of the processing vessel 10, a condenser 92 connected to a first drain pipe 91, and a mist trap 95 connected to the condenser 92 at the downstream thereof and having a liquid reservoir 95*a*. An open-close valve V9 is inserted in the first drain pipe 91. A sub-open-close valve V10 which facilitates an open/close operation opposite to that of the open-close valve V9, and an orifice are inserted in a bypass pipe 94 bypassing the open-close valve V9. An open-close valve V11 is inserted in the second drain pipe 93. For the risk that ozone may remain in the liquid, the second drain pipe 93 is connected to the "factory acid drain" 123, which is a drain system exclusive for acid liquids and is provided in the factory where the substrate processing apparatus of the present invention is installed.

In the mist trap 95, four water level sensors 96, 97, 98 and 99 are arranged sequentially from the bottom. The CPU 100 opens and closes the open-close valves V9, V10 and V11 based on detected signals from the sensors 96, 97, 98 and 99. During a cleaning operation, the open-close valve V9 is kept closed while the open-close valve V10 is kept opened to drain small amounts of ozone and steam from the interior of the processing vessel 10, whereby a pressure in the processing vessel 10 is adjusted. After the cleaning operation, the open-close valve V10 is closed while the open-close valve 9 is opened to exhaust the interior of the processing vessel 10.

Water stays in the mist trap 95 and raises a water level, and when the water surface is detected by the sensor 87, the open-close valve V11 is opened in response to the control signal from the CPU 100 to start draining the liquid. When the water level of the mist trap 95 is lowered, and the liquid surface is detected by the sensor 98, the open-close valve V11 is closed in response to the control signal from the CPU 100 in order to stop draining the liquid. When the water level in the mist trap 95 abnormally rises, and a height of the water surface reaches the sensor 99, an alarm signal from the sensor 98 is sent to the CPU 100.

When the water level in the mist trap 95 abnormally lowers, and the liquid surface is lower than the sensor 96, the open-close valve V11 is closed in response to the control signal from the CPU 100, thereby preventing the leakage of the ozone gas into the factory acid drain due to the emptiness of the mist trap 95.

An exhaust pipe 110 is connected to an upper part of the mist trap 95, and the ozone killer 80 and an exhaust manifold 81 are inserted in the exhaust pipe 110.

The steam and the ozone gas, which are exhausted from the interior of the processing vessel 10 through the first liquid drain pipe 91, flow into the mist trap 95 through the condenser 92. The steam exhausted from the interior of the processing vessel 10 is cooled and condensed during passage through the condenser 92. The condensed water flows down into the mist trap 95, and is discharged from the mist trap 95 through the second drain pipe 93. On the other hand, the ozone gas (not condensed) is introduced into the mist trap 95, and is discharged from the mist trap 95 through the exhaust pipe 110.

Figure 6:
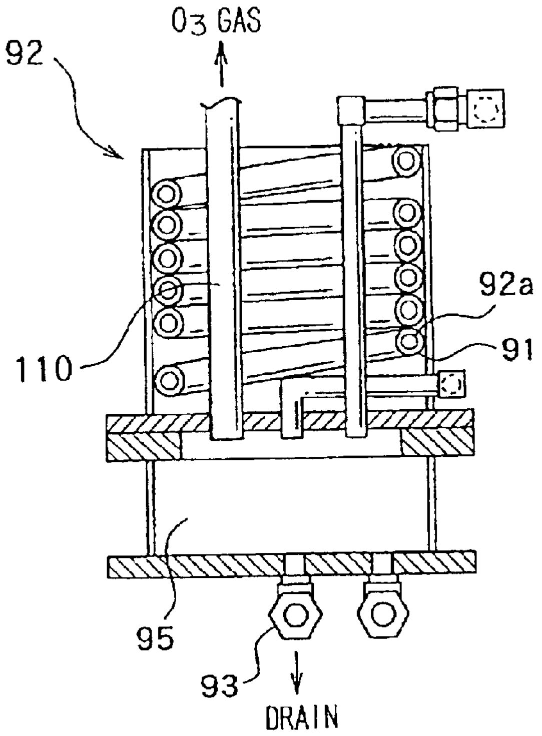
FIG. 6 is a cross-sectional view of the condenser taken along the line VI—VI in FIG. 5.

As shown in FIG. 6, the condenser 92 has a double-pipe structure including a cooling water supply pipe 92*a* connected to a cooling water supply source 125 disposed in a helical portion of the first drain pipe 91. The steam and the ozone gas flows down through the first drain pipe 91, and the cooling water flows up through the cooling water supply pipe 92*a*. Thus, the heat exchange rate can be higher, and the condenser 92*a* can be down-sized.

Similar to the condenser 92, the condenser 192 has a double-pipe structure having a cooling water supply pipe 92*a* disposed in a helical portion of the exhaust pipe 39. In the condenser 192, the steam flows down through the exhaust pipe 30, and the cooling water flows up through the cooling water supply pipe 92*a*.

Figure 7:
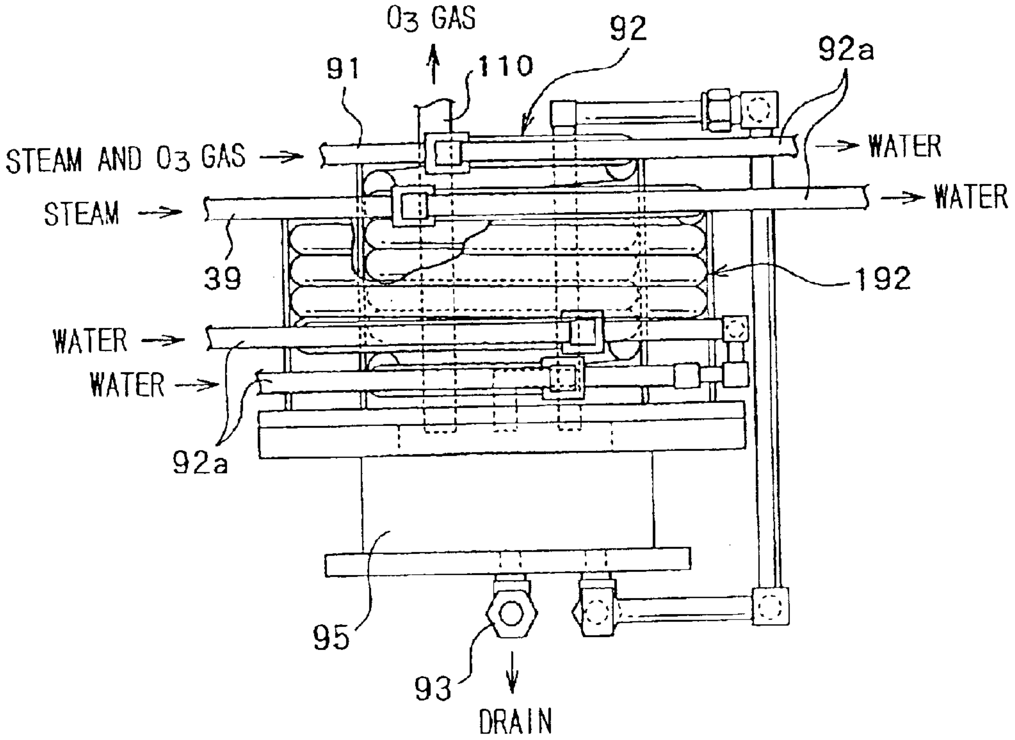
FIG. 7 is a side view of an integrated condenser in which the condenser shown in FIG. 4 and another condenser is arranged together.
Figure 8:
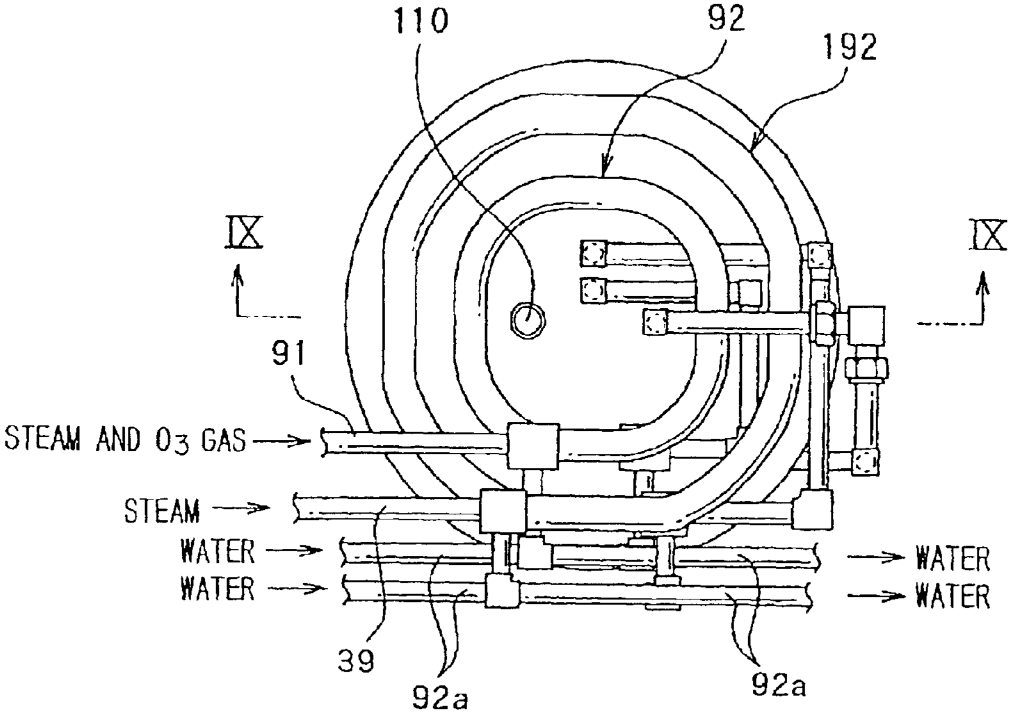
FIG. 8 is a plan view of the condenser shown in FIG. 7.
Figure 9:
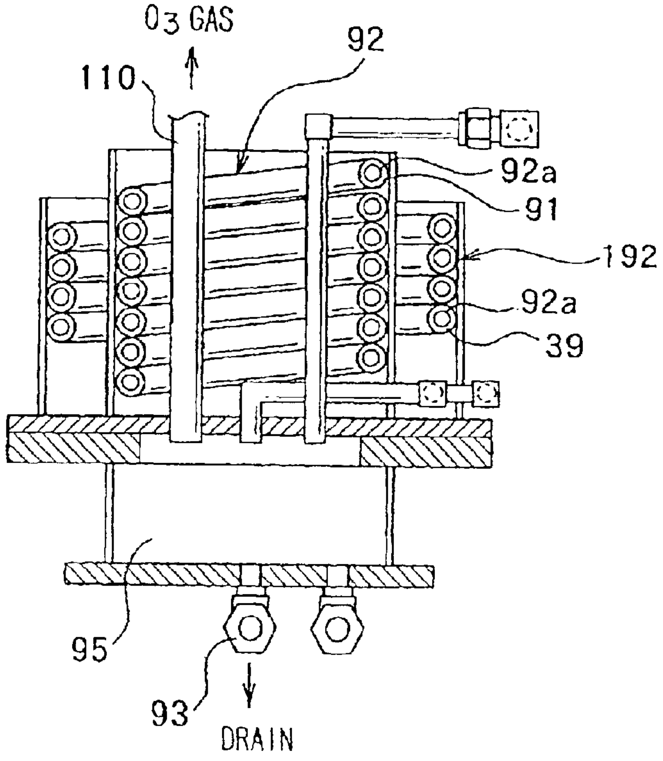
FIG. 9 is the cross-sectional view of the condenser taken along the line IX—IX in FIG. 8.

The condenser 92 and the condenser 192 are arranged separate from each other. However, the condenser 92 and condenser 192 may be integrally arranged. As shown in FIGS. 7 and 9, the helical condenser 192 of a larger diameter than a diameter of the helical condenser 92 may be disposed outside the condenser 92 coaxially with each other. The condenser 192 may be disposed inside, and the condenser 92 may be disposed outside. Since the condensers 92 and 192 are arranged coaxially with each other, the cleaning apparatus as a whole can be down-sized. The condensers 92 and 192 may be structured by arranging the first drain pipe 91 and the exhaust pipe 39 in the cooling water supply pipe 92*a*.

The ozone killer 80 heats the ozone gas to thermally decompose the ozone to convert it into oxygen. A treating temperature of the ozone killer 80 is above 400° C. It is preferable, for safety reasons, that the ozone killer 80 is connected to a power-failure-free power supply (not shown) provided in the factory so that electric power can be stably supplied to the ozone killer 80 even in the event of an electrical power failure. Since the (ozone) gas is abruptly inflated in the ozone killer 80 and the ozone killer 80 has a helical exhaust passage, the ozone killer 80 acts as an exhaust resistance of the exhaust system.

The ozone killer 80 has a temperature sensor (not shown) which detects an operational state of the ozone killer 80. The temperature sensor detects a temperature of the ozone killer 80. The CPU 100 judges whether the ozone killer 80 is sufficiently prepared to decompose the ozone into oxygen based on detected signals from the temperature sensor.

The oxygen gas generated by decomposing ozone gas in the ozone killer 80 is exhausted into a factory acid exhaust 122, which is a exhaust system exclusive for acid gas and is provided in the factory. Since temperature of the ozone killer 80 is high (e.g., 400°), the ozone killer 80 is cooled with cooling water fed from a cooling water supply source 125. The cooling water used for the cooling is drained to a drain system 121 of the factory.

The exhaust gases discharged through the respective exhaust pipes of the processing apparatus are collected in the exhaust manifold 81. A plurality of pipes (not shown) for taking in an atmosphere behind the processing apparatus in order to prevent the diffusion of the ozone gas from the processing apparatus, are connected to the exhaust manifold 81. The exhaust manifold 81 is connected to the factory acid exhaust 122.

An ozone concentration sensor (not shown) is disposed in the exhaust manifold 81. Based on a detected signal from the ozone concentration sensor, the CPU 100 monitors an ozone removing capacity of the ozone killer 80. If a large amount of the ozone gas flows to the factory acid exhaust 122 due to a malfunction of the ozone killer 80 for example, such a malfunction can be detected.

Next, the exhaust system 60 will be explained. The exhaust system 60 discharges a gas (and steam) in the processing vessel 10 into the ozone killer 80 without passing the gas through the condenser 92 and the mist trap 95. The exhaust system 60 includes an exhaust port 61 provided in the processing vessel 10; an exhaust pipe 62 connecting the exhaust port 61 to the exhaust pipe 110; and a first exhaust open-close valve V13, an ejector 63 and a mist separator 66 inserted sequentially in the exhaust pipe 62.

A sub-exhaust pipe 68 is connected to a lower part of the processing vessel 10. The sub exhaust pipe 68 is connected to the exhaust pipe 62 downstream of the first exhaust open-close valve V13. Inserted in the sub exhaust pipe 68A is a relief valve CV2, which releases the pressure in the processing vessel 10 when pressure in the processing vessel 10 is abnormally high.

A branched exhaust pipe 64 connects the exhaust pipe 62 to the exhaust pipe 110. The exhaust pipe 64 has one end connected to the exhaust pipe 62 at a position upstream of the first exhaust open-close valve V13, and the other end connected to exhaust pipe 110 at a position between the ozone killer 80 and the manifold 81.

A second exhaust open-close valve V14 and a damper 65 are inserted in the branched exhaust pipe 64, and is connected to an exhaust pipe 64*a*, which exhausts the interior of a case 71, which will be described later (see FIG. 1). The first exhaust open-close valve V13, the second exhaust open-close valve V14 and the damper 65 are operated in response to control signals from the CPU 100.

A negative pressure, generated by supplying the air fed from the air supply source 55 to the ejector 63 through the open-close valve V16, is utilized to exhaust the steam and the ozone gas from the processing vessel 10 by suction. The open-close valve V13 and the open-close valve V16 are operated in response to control signals from the CPU 100. The mist separator 66 inserted in the exhaust pipe 62 separates water, which is a condensed steam condensed when travelling in the exhaust pipe 60 from the processing vessel 10 to the mist separator 66. The water in the mist separator 66 is drained to a drain pipe 72 (which will be described later).

The diffusion preventing means 70 includes the case 71 surrounding the processing vessel 10, and the drain pipe 72 having one end connected to the bottom of the case 71 and the other end connected the factory acid drain 123.

In the case 71, a down-flow of clean air is fed from above. The down-flow prohibits the leakage of an internal atmosphere of the case 71, namely an atmosphere surrounding the processing vessel 10, from leaking outside the case 71. The internal atmosphere of the case 71 moves downward with the down-flow, and is led into the exhaust pipe 64*a* and the drain pipe 72.

An ozone concentration sensor (not shown) for detecting an ozone concentration of a peripheral atmosphere of the processing vessel 10 is provided in the case 71. Based on a detected signal supplied by the ozone concentration sensor, the CPU 100 detects leakage of the ozone gas.

The drain pipe 72 is connected to a drain pipe 67, which passes the condensed water separated by the mist separator 66 inserted downstream of the ejector 63. An open-close valve V15 is inserted in the drain pipe 67. The drain pipe 72 is connected to the second drain pipe 93 connected to the mist trap 95.

Next, the operational steps of the substrate processing apparatus according to the present invention will be explained. TABLE 1 shows the states of the respective open-close valves in the respective steps.

TABLE 1

| PROCESS STEPS | V1 | V4 | V5 | V6 | V7 | V8 | V9 | V10 | V13 | V14 | V16 |
|---|---|---|---|---|---|---|---|---|---|---|---|
| $O_3$/Steam process | O | O | C | C | C | C | C | O | C | C | C |
| Air-purge(1) | C | C | C | O | O | C | O | C | C | C | C |
| Air-purge(2) | C | C | C | C | C | O | O | C | C | C | C |
| Air-purge(1) + (2) | C | C | C | O | O | O | O | C | C | C | C |
| Steam/Air purge(1) | O | C | C | O | O | C | O | C | C | C | C |
| Steam/Air purge(2) | O | C | C | C | C | O | O | C | C | C | C |

TABLE 1-continued

| PROCESS STEPS | V1 | V4 | V5 | V6 | V7 | V8 | V9 | V10 | V13 | V14 | V16 |
|---|---|---|---|---|---|---|---|---|---|---|---|
| Steam/Air purge(1) + (2) | O | C | C | O | O | O | O | C | C | C | C |
| Stop feeding purge gas | C | C | C | C | C | C | O | C | C | C | C |
| Stop feeding purge gas and exhaust by ejector | C | C | C | C | C | C | C | C | O | C | O |
| Exhaust by ejector | C | C | C | C | C | O | C | C | O | C | O |

O . . . Opened
C . . . Closed

First, wafers W are loaded into the processing vessel 10. Next, the open-close valves V5 and V6 of the air supply system 50 are opened, the second exhaust open-close valve V14 is opened, and the hot air generator 52 is actuated. Hot air at a temperature of about 280° C. is fed into the processing vessel 10, whereby a temperature of the wafers W and an atmospheric temperature in the processing vessel 10 are raised from the room temperature (25° C.) to a prescribed temperature, e.g., 80–90° C. (Wafer Temperature Raising Step).

Then, the ozone gas generator 41 is actuated to generate ozone gas. The sub open-close valve V10 is opened (the open-close valve V9 is closed), the open-close valve V4 is opened, and the ozone gas is fed into the processing vessel 10. At this time, the ozone gas of about 9 vol % (percent by volume) ozone concentration is supplied at a flow rate of about 10 L/min (liters per minute). Thereby, pressure in the processing vessel 10 becomes higher by 0.01–0.03 MPa than the atmospheric pressure (0.1 MPa) (Pre-Pressuring Step).

The pre-pressuring step using the ozone gas prevents, in the $O_3$/steam processing step (which will be described later), steam fed into the processing vessel 10 from condensing on the inside wall of the processing vessel 10, the surfaces of the wafers W, etc. due to a pressure difference. Furthermore, the pre-pressuring step modifies the surface of a hydrophobic resist, such as ArF resist, having poor wettability so that the steam can be easily adsorbed on the surface. Furthermore, during the pre-pressuring step, the concentration of the ozone gas generated by the ozone gas generator 41 becomes sufficiently stable and high. Thus, a sufficient concentration of the ozone gas can be supplied in the following $O_3$/steam processing step. In addition, during the period of time when the pre-pressuring step is carried out, temperature distribution of the wafers, having been heated in the wafer temperature raising step, becomes uniform.

After the pre-pressuring step is performed for a prescribed period of time (e.g., 1–2 minutes), the ozone gas is continuously fed into the processing vessel 10. The open-close valve V1 is opened to feed steam into the processing vessel 10 from the steam supply system 30. In this state, water molecules and ozone molecules react with each other on the surfaces of the wafers W to generate oxygen atom radicals and hydroxyl group radicals. These radicals decompose a resist film, which is not water-soluble, into carboxylic acid, carbon dioxide, water, etc., and the resist film is thus modified to a water-soluble film. At this time, the open-close valve V9 is closed, and the sub-open-close valve V10 is opened ($O_3$/steam processing step; see "$O_3$/steam process" in TABLE 1).

Finally, the ozone gas in the processing vessel 10 is air-purged by either of the methods, which will be described later (Air-Purging step). Then, the loading/unloading opening 14 of the vessel body 10 is opened to unload the wafers W. The unloaded wafers W are conveyed to a rinse apparatus (not shown) to be rinsed. The resist film deformed to a water-soluble film is removed from the wafers W by rinsing. The wafers are conveyed to a drying apparatus (not shown) to be dried.

The purging methods will be explained with reference to FIG. 1 to 3 and FIGS. 10 to 12.

First Purging Method

After the wafers W have been processed by supplying the ozone gas and the steam into the processing vessel 10 (after the $O_3$/steam processing step has been completed), air is supplied from the air supply source 55 connected to the ozone gas supply pipe 42 to purge the ozone gas and the steam remaining in the ozone gas supply pipe 42 and the processing vessel 10.

In this method, after the $O_3$/steam processing step has been completed, in response to control signals from the CPU 100, the open-close valve V4 is closed, and the open-close valve V8 is opened. Air is thus fed into the processing vessel 10 from the air supply source 55 through the air supply pipe 51B and the ozone gas supply pipe 42. The open-close valve V9 is opened, and the sub open-close valve V10 is closed. The ozone gas remaining in the ozone gas supply pipe 42 and the processing vessel 10 is expelled therefrom by the air and discharged from the processing vessel 10 through the pipe 91. An air atmosphere is established in the processing vessel 10 (see "Air-purge (2)" in TABLE 1).

The interior of the processing vessel 10 may be exhausted by suction using the ejector 63, in place of exhausting via the pipe 91. In this case, the open-close valve V8 is opened to feed the air into the processing vessel 10 while the open-close valves V9, V10 are closed, and the open-close valve V13 is opened. Then, the open-close valve V16 is opened, and the ejector 63 is actuated (see "Exhaust by ejector" in TABLE 1).

Conventionally, a raw material gas oxygen ($O_2$) to be fed to the ozone gas generator 41 is used to purge the ozone gas and the steam remaining in the ozone gas supply pipe 42, the ozone gas generator 41 and the processing vessel 10. Accordingly, the purging efficiency is low, and throughput cannot be improved. However, the first purging method makes it unnecessary to purge the interior of the ozone gas generator 41 with the oxygen, which makes it possible to efficiently purge the ozone gas and the steam remaining in the processing vessel 10, with a result of higher throughput.

Second Purging Method

After the $O_3$/steam processing step has been completed, air is intermittently fed into the processing vessel 10 for a prescribed period of time to purge the ozone and the steam remaining in the processing vessel 10.

In this case, the air is fed: (i) from the air nozzles 54 through the second air supply pipe 53; (ii) from the ozone gas nozzles 43 through the air supply pipe 51B; or (iii) both from the air nozzles 54 and from the ozone gas nozzles 43.

(i) Feeding and stopping feeding of the air from the air nozzles 54 are performed by opening and closing V6 and V7, with the open-close valve V9 being opened and the sub open-close valve V10 being closed, after the open-close valves V1 and V4 have been closed to stop supplying the steam and the ozone gas. The open-close valves V6 and V7 are opened and closed by the CPU 100; the open-close valves V6 and V7 are opened for a prescribed period of time of, e.g., 20 seconds (see "Air-purge (1)" in TABLE 1), and closed for a prescribed period of time of e.g., 25 seconds (see "Stop feeding purge gas", in TABLE 1). Such opening and closing operations are repeated a number of prescribed times, e.g., seven times.

(ii) Feeding and stopping feeding the air from the air supply pipe 51B are performed by opening and closing the open-close valve V8 with the open-close valve V9 being opened and the sub open-close valve V10 being closed, after the open-close valves V1 and V4 have been closed to stop supplying the steam and the ozone gas. The open-close valve V8 is opened and closed by the CPU 100; the open-close valve V8 is opened for a prescribed period of time of, e.g., 20 seconds (see "Air-purge (2)" in TABLE 1), and the open-close valve V8 is closed for a prescribed period of time of, e.g., 25 seconds (see "Stop feeding purge gas" in TABLE 1). Such opening and closing operations are repeated a prescribed number of times, e.g., seven times.

(iii) In the event that the air is supplied by means of both the air nozzles 54 and the ozone gas nozzles 43, the open-close valves V6, V7 and V8 are opened and closed with the open-close valve V9 being opened and the sub open-close valve V10 being closed, after the open-close valves V1 and V4 have been closed to stop supplying the steam and the ozone gas. The open-close valves V6, V7 and V8 are opened and closed by the CPU 100; the open-close valves V6, V7 and V8 are opened for a prescribed period of time of, e.g., 20 seconds (see "Air-purge (1)+(2)" in TABLE 1), and are closed for a prescribed period of time of, e.g., 25 seconds. Such opening and closing operations are repeated a prescribed number of times, e.g., 7 times.

Pressure in the processing vessel 10 increases to a pressure greater than an atmospheric pressure by feeding the air. The pressure in the processing vessel 10 is reduced after stopping feeding the air into the processing vessel. Preferably, the feed of the air restarts when the pressure in the processing vessel 10 is reduced to a pressure below the atmospheric pressure.

According to the second purging method, even if a gas in the processing vessel 10 should stagnate when the air is fed into the processing vessel 10, the stagnant gas is diffused when the air feeding is stopped, resulting in higher purging efficiency.

It should be noted that it is preferable but not absolutely necessary to stop feeding the air into the processing vessel 10. In other words, the purging process may be carried out by feeding the air at a first flow rate and feeding the air at a second flow rate lower than the first flow rate, alternately.

Preferably, the system is configured so that the air can be fed from the air supply source 55 through an open-close valve into the steam supply pipe 34. In such a case, ozone gas that has intruded into the steam supply pipe 34 also can be purged quickly.

Third Purging Method

After the wafers W have been processed by supplying the ozone gas and the steam into the processing vessel 10, air and steam are intermittently fed into the processing vessel 10 for a prescribed period of time to purge the processing vessel 10.

In this case, feeding and stopping feeding the steam is performed by opening and closing the open-close valve V1 with the open-close valve V9 being opened and the sub open-close valve V10 being closed, after the open-close valve V4 has been closed in order to stop feeding the ozone gas. The air feed is the same as in the above-described second process, and thus its explanation is not repeated herein. The open-close valve V1 is opened and closed by the CPU 100; the open-close valve V1 is opened for a prescribed period of time, e.g., 20 seconds (see "Steam/Air purge (1)", "Steam/Air purge (2)" and "Steam/Air purge (1)+(2)" in TABLE 1), and is closed for a prescribed period of time of, e.g., 25 seconds (see "Stop feeding purge gas" in TABLE 1). Such opening and closing operations are repeated a prescribed number of times, e.g., seven times.

According to the third purging method, the ozone remaining in the processing vessel 10 is absorbed by the steam and is exhausted together with the steam, resulting in higher purging efficiency.

Similar to the second purging method, the third purging method may be carried out by feeding the steam/air at a first flow rate and feeding the steam/air at a second flow rate lower than the first flow rate, alternately.

Fourth Purging Method

When air feeding is stopped in the second purging method or when air/steam feeding is stopped in the third purging method, an atmosphere in the processing vessel 10 is sucked by means of the ejector 63.

The open-close valves V1, V6 and V7 are closed to stop feeding the air and the steam. Thereafter, the open-close valve V16 is opened in response to a control signal of the CPU 100 to actuate the ejector 63 while closing the open-close valves V9 and V10, and opening the open-close valve V13. Whereby, the steam, the ozone gas and the air present in the processing vessel is removed by suction (see "Stop feeding purge gas and exhaust by ejector" in TABLE 1).

The fourth purging method can decrease the period of time of the feed stop of the air (the air and the steam), resulting in higher purging efficiency.

The suction-exhaust by using the ejector 63 may be performed not only when the feed of the air (or the air and the steam) is stopped but also when the air (or the air and the steam) is fed into the processing vessel 10.

Fifth Purging Method

Figure 10:
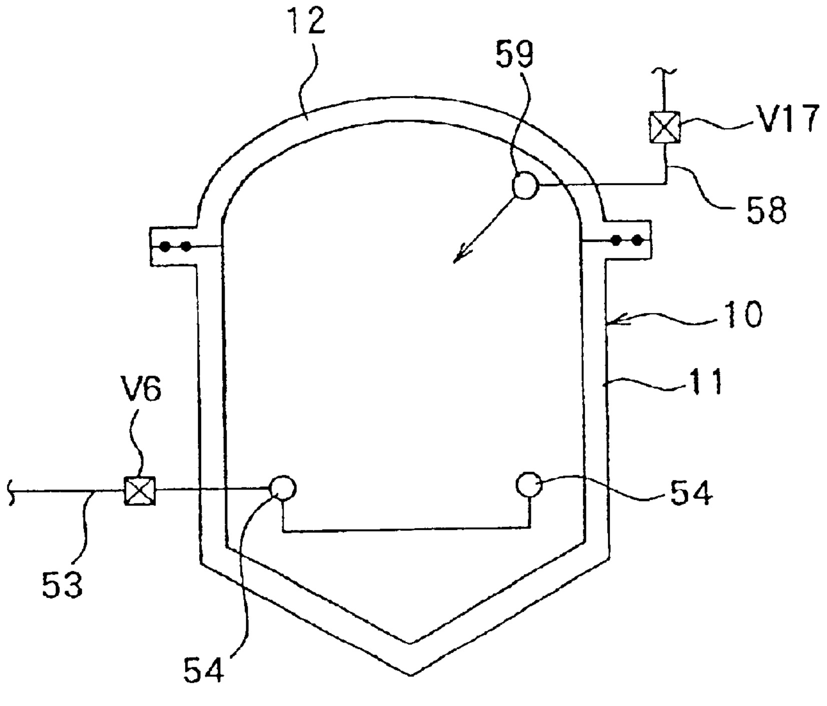
FIG. 10 is a cross-sectional view schematically showing an alternative example of the processing vessel having a stagnation-preventing nozzle.

To perform the fifth purging process, a second air nozzle 59 for preventing stagnation is further provided in the processing vessel 10 as shown in FIG. 10. Air is injected from the air nozzles 54, thereby forming streams of the air in the processing vessel 10. However, it is possible that stagnation may occur in certain regions, such as corners of the interior of the processing vessel 10 and the gaps between the wafers W, those regions likely being unexposed to the main stream of air.

It is difficult to remove the ozone present in the region where the stagnation is present. To overcome this problem, the second air nozzle 59 jets the air to the region where the stagnation is present, or directs streams of air toward the region where the stagnation is present.

The stagnation preventing nozzle 59 shown in FIG. 10 has the same structure as the air nozzles 54 shown in FIG. 13, and is arranged to jet the air directly to a series of the wafers W not shown in FIG. 10. The stagnation preventing nozzle 59 may have only one nozzle port. The stagnation nozzle 59 can jet the air to parts of the interior of the processing vessel 10 where the stagnation tends to take place.

The nozzle 59 is connected to the air supply source 55 through the air supply pipe 58 with an open-close valve V17 inserted therein. The open-close valve V17 is opened and closed in response to control signals from the CPU 100.

The fifth purging method can quickly diffuse the ozone gas in the processing vessel 10, resulting in higher purging efficiency.

Sixth Purging Method

Figure 11:
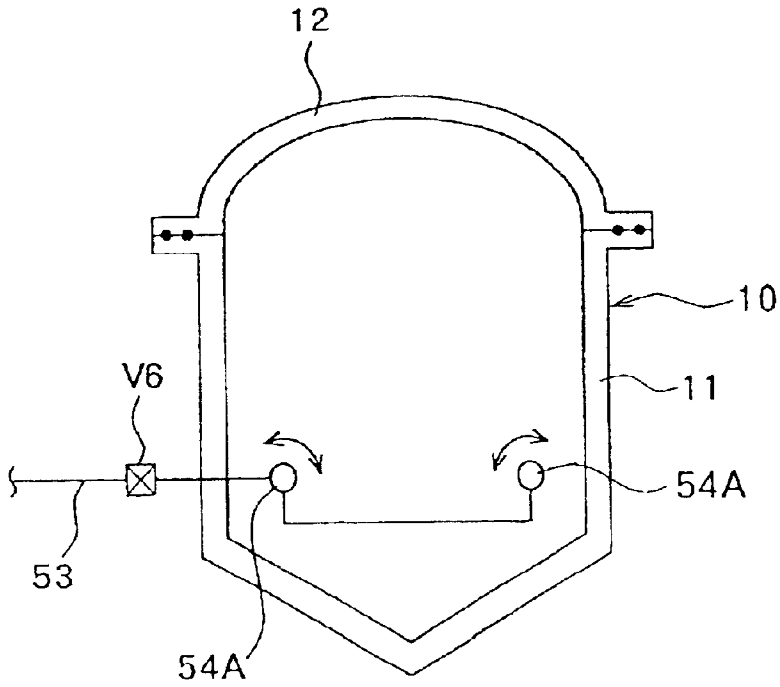
FIG. 11 is a cross-sectional view schematically showing an alternative example of the processing vessel having an air supply nozzle whose discharging direction is variable.

To perform the sixth purging method, a rotatable air nozzle 54A shown in FIG. 11 is provided in place of the stationary air nozzle 54 shown in FIGS. 1 and 2, so that the air can be injected from the air nozzle in various directions.

The air nozzle 54A is rotatable on the longitudinal axis by rotary drive means disposed outside the processing vessel 10 to thereby vary an angle of the air injection port. The rotary drive means varies a direction of the air injection port 54*a* in response to a control signal from the CPU 100. The rotary drive means can be a motor, which can be rotated intermittently clockwise and counterclockwise in a prescribed angle range.

The sixth purging process can vary the air streams formed in the processing vessel 10, whereby the occurrences of stagnation at specific parts of the interior of the processing vessel 10 can be prevented.

The ozone gas nozzles 43 may be rotatable and may also be used to discharge the air therefrom.

Seventh Purging Method

Figure 17:
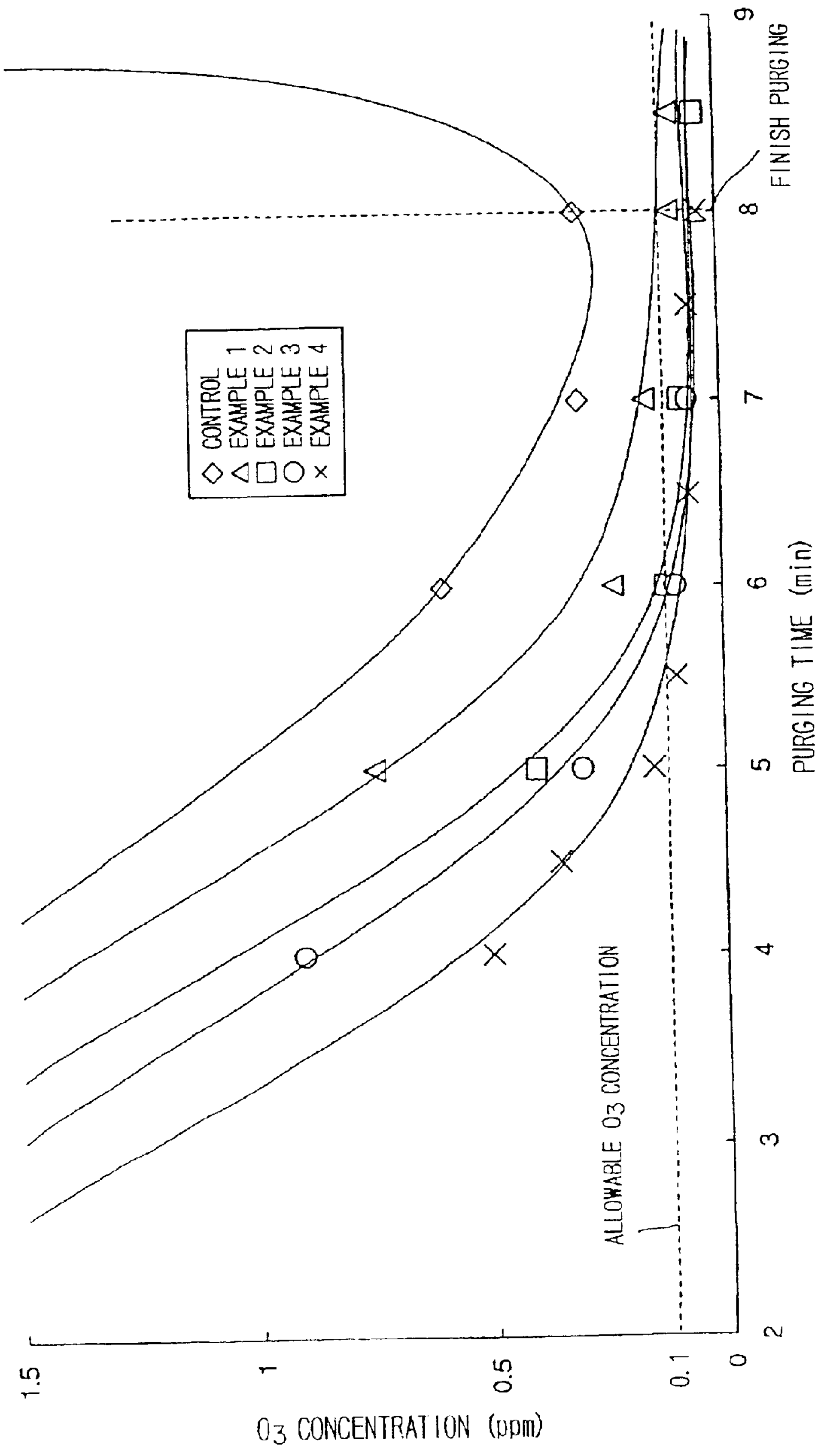
FIG. 17 is a graph showing the relationships between concentrations of the ozone gas in the processing vessel and the purging time.

To perform the seventh purging method, as shown in FIG. 17, means for varying a flow rate of the air to be injected from air nozzles is provided.

Figure 12:
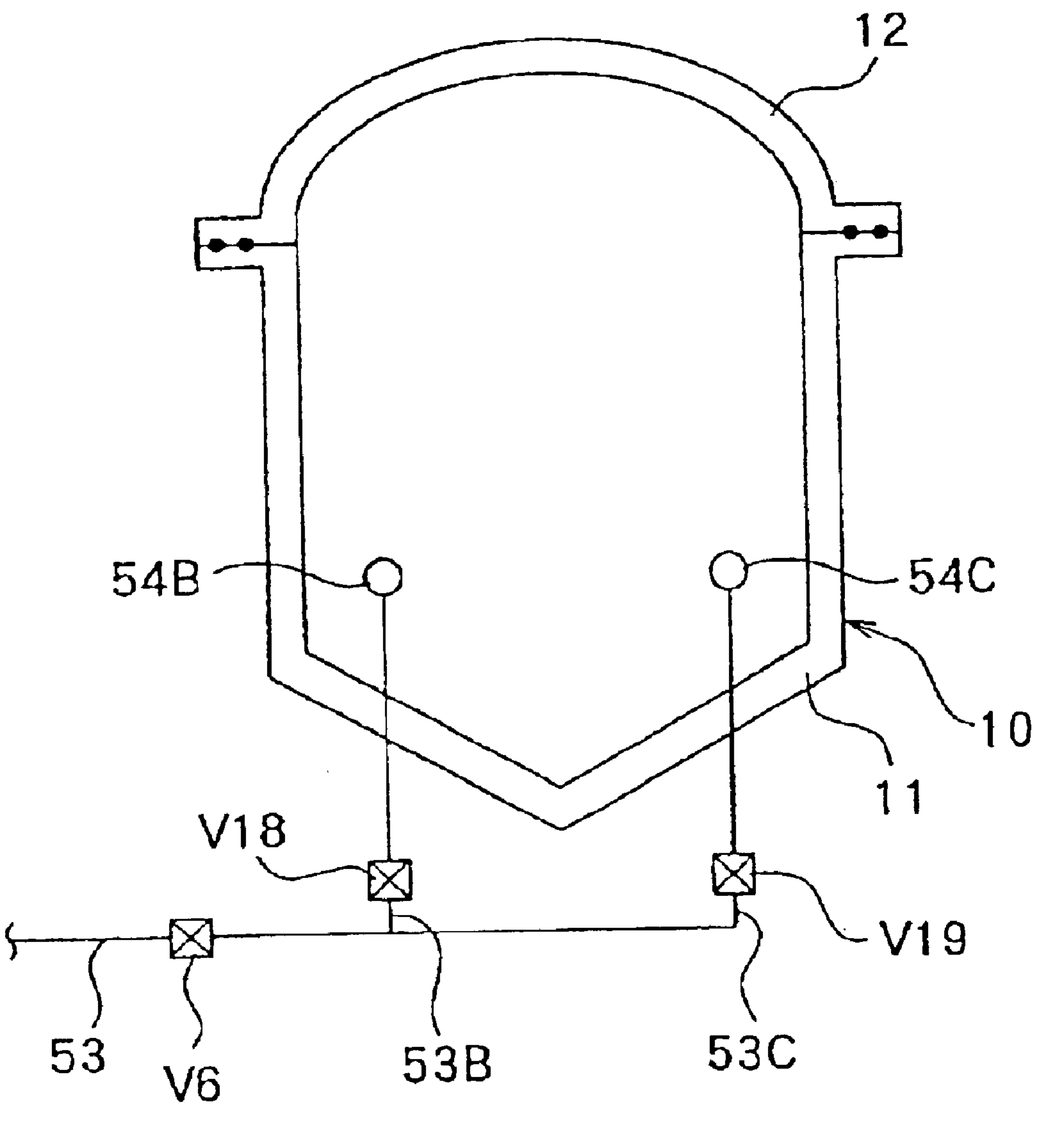
FIG. 12 is a cross-sectional view schematically showing an alternative example of the processing vessel having an air supply nozzle whose flow rate is adjustable.

The air nozzles 54B and 54C shown in FIG. 12 have the same structure as the air nozzle 54 shown in FIG. 13. Flow rate adjusting valves V18 and V19, which can adjust a flow rate of the air to be fed respectively to the air nozzles 54B and 54C, are inserted in the air supply pipes 53B and 53C, which connect the air supply pipe 53 to the air nozzles 54B and 54C, respectively. The flow rate adjusting valves V18 and V19 have openings adjusted in response to control signals from the CPU 100, whereby flow rates of the air to be injected from the air nozzles 54B and 54C are adjusted.

The seventh purging method can vary the condition of streams of the air formed in the processing vessel 10, whereby the occurrence of the stagnation can be prevented. The ozone gas nozzle 43 may be arranged to inject the air, and a flow rate of the air to be injected from the ozone gas nozzle 43 may be made variable by means of a flow rate adjusting valve.

EXAMPLES

Experiments were made to confirm changes of the purging efficiency of the purging methods. The wafer temperature increasing step, the pre-pressuring step (3 minutes) and the $O_3$/steam processing step (10 seconds) were followed by the 8 minute-purging processes of a Control and Examples 1 to 4.

Control:

After stopping energizing the ozone gas generator 41, oxygen gas was fed into the ozone gas generator 41 from the oxygen gas source for 2 minutes to feed the oxygen gas into the processing vessel 10 through the ozone gas supply pipe 42.

Thereafter, the internal atmosphere of the processing vessel 10 was sucked by means of the ejector 63 for 2 minutes with the open-close valves V1, V4, V6, V8, V9, V10 and V14 being closed and the open-close valves V13 and V16 being opened. Thereby, the pressure in the processing vessel 10 was reduced to a pressure slightly below the atmospheric pressure.

Thereafter, the open-close valves V1, V4, V8, V13 and V14 were closed, and the open-close valves V6, V7, V9 and V10 were opened, thereby purging the processing vessel 10 with cool dry air for 4 minutes.

Example 1

The processing apparatus was set to be in the condition "air-purge (1)+(2)" shown in Table 1 for 15 seconds. Next, the open-close valves V7 and V8 were closed for 20 seconds to stop feeding the air, and then open-close valves V7 and V8 were opened for 15 seconds. Opening and closing operations of the open-close valves V7 and V8 were performed alternately and repeatedly.

Example 2

The processing apparatus was set to be in the condition "air-purge (1)+(2)" shown in Table 1 for 25 seconds. Next, the open-close valves V7 and V8 were closed for 25 seconds to stop feeding the air, and then open-close valves V7 and V8 were opened for 15 seconds. Opening and closing operations of the open-close valves V7 and V8 were performed alternately and repeatedly.

Example 3

The processing apparatus was set to be in the condition "air-purge (1)+(2)" shown in Table 1 for 25 seconds. Next, the open-close valves V7 and V8 were closed for 25 seconds to stop feeding the air, and then open-close valves V7 and V8 were opened for 15 seconds. Opening and closing operations of the open-close valves V7 and V8 were performed alternately and repeatedly.

Example 4

The processing apparatus was set to be in the condition "steam/air-purge (1)+(2)" shown in Table 1 for 4 seconds. Next, the processing apparatus was set to be in the condition "air-purge (1)+(2)" shown in Table 1 for 16 seconds. Next, the open-close valves V7 and V8 were closed for 25 seconds to stop feeding the air. Then, the processing apparatus was set to be in the condition "steam/air-purge (1)+(2)" again. These operations were performed in the above-mentioned order, repeatedly.

The volume of the processing vessel 10 was 44.6 liters.

In the Control, the $O_2$ feeding rate was 10 L/min (liters per minute).

In Examples 1 and 2, the air feeding rate of "air-purge (1)" was 80 L/min.

In Examples 3 and 4, the air feeding rate of "air-purge (1)" was 140 L/min.

In Examples 1 to 4, the air feeding rate "air-purge (2)" was 40 L/min.

In Example 4, the steam feeding rate was 100 ml/min, and the temperature of the steam was 120° C.

FIG. 17 is a graph of transient changes of the ozone gas concentrations in the processing vessel, which occured from the start of the purging processes of the Control and Examples 1 to 4.

As shown in FIG. 17, the conventional process (the Control) could not decrease the ozone gas concentration in the processing vessel to below the tolerable value (0.1 ppm) by the 8 minute-purge. Moreover, after the purging process has been completed, the ozone gas concentration in the processing vessel is increased again. This is resulted from stagnation in the processing vessel and the ozone gas remaining in the ozone gas supply pipe.

However, Examples 1 to 4 could decrease the ozone gas concentrations in the processing vessel to below the tolerable value in 8 minutes.

What is claimed is:

1. A substrate processing apparatus comprising:

a processing vessel;

an ozone generator adapted to generate ozone gas;

a steam generator adapted to generate water vapor;

an ozone gas supplying path connecting the ozone generator to the processing vessel;

a steam supplying path connecting the steam generator to the processing vessel;

an air supplying path connected to the ozone gas supplying path to feed air into the processing vessel through the ozone gas supplying path;

a first valve set including at least one valve and having a first state allowing ozone gas to be supplied from the ozone generator to the processing vessel through the ozone supplying path while preventing air from being supplied from the air supplying path to the processing vessel through the ozone gas supplying path, and a second state allowing air to be supplied from the air supplying path to the processing vessel through the ozone gas supplying path while preventing ozone gas from being supplied from the ozone generator to the processing vessel through the ozone gas supplying path; and a controller configured to control the first valve set so that the first valve set is in the first state when a substrate is processed in the processing vessel with ozone gas supplied from the ozone generator and water vapor supplied from the steam generator, and the first valve set is in the second state when the processing vessel is purged with air after the substrate has been processed with ozone gas and water vapor.

2. The apparatus according to claim 1 further comprising:

an exhaust path connected to the processing vessel; and an ejector arranged in the exhaust path to suction an atmosphere in the processing vessel through the exhaust path, wherein the first valve set further includes a third state preventing both ozone gas and air from being supplied to the processing vessel;

the controller is further configured to control the first valve set and the ejector to achieve a first condition and a second condition when the processing vessel is purged with air such that, in the first condition, the first valve set is in the second state so that air is supplied to the processing vessel without the ejector suctioning an atmosphere in the processing vessel and, in the second condition, the first valve set is in the third state so that the air is not supplied to the processing vessel while the ejector suctions an atmosphere in the processing vessel.

3. The apparatus according to claim 1, wherein the air supplying path is provided therein with a flow control device adapted to control a flow rate of air being supplied to the processing vessel through the air supplying path and the ozone gas supplying path, and the controller is configured to control the flow control device so that a flow rate of air being supplied to the processing vessel increases and decreases alternately when the processing vessel is purged with air.

4. The apparatus according to claim 3, wherein the controller is configured to control the flow control device so that the flow rate of air being supplied to the processing vessel starts to increase when the pressure in the processing vessel, which has increased to a first pressure due to increase of the flow rate of air, is reduced to a second pressure lower than the first pressure.

5. The apparatus according to claim 3 or 4, wherein the flow control device is an open-close valve which is one of said at least one valve of the first valve set, and the controller is configured to control the open-close valve to be opened and closed alternately, whereby the flow rate of the air being supplied to the processing vessel is alternately changed between a first flow rate and a second flow rate smaller that the first flow rate, the second flow rate being zero.

6. A substrate processing apparatus comprising:

a processing vessel;

an ozone supply system adapted to supply ozone gas to the processing vessel, and including an ozone generator and an ozone supplying path connecting the ozone generator to the processing vessel;

a steam supply system adapted to supply water vapor to the processing vessel, and including a steam generator and a steam supplying path connecting the steam generator to the processing vessel;

an air supply system adapted to supply air into the processing vessel, the air supply system including an air supplying path through which air is supplied from an air source to the processing vessel and to the ozone supplying path and a flow control device adapted to control a flow rate of air being supplied to the processing vessel through the air supplying path;

an exhaust system including an exhaust path connected to the processing vessel to discharge an atmosphere in the processing vessel through the exhaust path; and a controller configured to control the ozone supply system, steam supply system and the air supply system so that ozone gas and water vapor are supplied to the processing vessel when a substrate is processed with ozone gas and water vapor, and air is supplied to the processing vessel to purge the processing vessel after the substrate has been processed by controlling the flow control device to alternately increase and decrease a flow rate of the air being supplied to the processing vessel.

7. The apparatus according to claim 6, wherein the controller is configured to control the flow control device so that the flow rate of air being supplied to the processing vessel starts to increase when pressure in the processing vessel, which has increased to a first pressure due to increase of the flow rate of air, is reduced to a second press lower than the first pressure.

8. The substrate processing apparatus according to claim 6, wherein the exhaust system further includes an ejector arranged in the exhaust path to suction an atmosphere in the processing vessel, and the controller is configured to control the ejector so at the ejector suctions the atmosphere in the processing vessel, when the flow rate of air is decreased.

9. The substrate processing apparatus according to claims 6, 7 or 8, wherein the flow control device comprises an open-close valve, and the control is configured to close the open-close valve so that the flow rate of the air being supplied to the processing vessel is alternately changed between a first flow rate and a second flow rate smaller than the first flow rate, the second flow rate being zero.

10. A substrate processing apparatus comprising:

a processing vessel;

an ozone supply system adapted to supply ozone gas to the processing vessel, and including an ozone generator and an ozone supplying path connecting the ozone generator to the processing vessel;

a steam supply system adapted to supply water vapor to the processing vessel, and including a steam generator and a steam supplying path connecting the steam generator to the processing vessel, and a steam flow control device adapted to control a flow rate of wafer vapor being supplied to the processing vessel through the steam supplying path;

an air supply system adapted to supply air into the processing vessel, the air supply system including an air supplying path through which air is supplied from an air source to the processing vessel and an air flow control device adapted to control a flow rate of air being supplied to the processing vessel through the air supplying path;

an exhaust system including an exhaust path connected to the processing vessel to discharge an atmosphere in the processing vessel through the exhaust path; and a controller configured to control the ozone supply system, steam supply system and the air supply system so that ozone gas and water vapor are supplied to the processing vessel when a substrate is processed with ozone gas and water vapor, and air and water vapor are supplied to the processing vessel to purge the processing vessel after the substrate has been processed by controlling the flow control devices of the air supply system and the steam supply system to concurrently and repeatedly increase or decrease the flow rates of the air and water vapor being supplied to the processing vessel.

11. The substrate processing apparatus according to claim 10, wherein the controller is configured to control the flow control devices of the air supply system and the steam supply system so that the flow rates of air and water vapor being supplied to the processing vessel start to increase when pressure in the processing vessel, which has increased to first pressure due to increase of the flow rates of air and water vapor, is reduced to a second presstire lower than the first pressure.

12. The substrate processing apparatus according to claim 10, wherein the exhaust system further includes an ejector arranged in the exhaust path to suction an atmosphere in the processing vessel, and the controller is configured to control the ejector so at the ejector suctions the atmosphere in the processing vessel, when the flow rates of air and water vapor are decreased.

13. The substrate processing apparatus according to claims 10, 11 or 12, wherein the flow control device of the air supply system comprises an open-close valve, the flow control device of the steam supply system comprises an open-close vale, and the controller is configured to control the open-close valves to achieve a first condition and a second condition, wherein, in the first condition, both the open-close valves of the steam supply system and the air supply system are opened, whereby water vapor is supplied to the processing vessel at a first water-vapor flow rate, and air is supplied to the processing vessel at a first air flow rate and wherein, in the second condition, both the open-close valves of the steam supply system and the air supply system are closed, whereby water vapor is supplied to the processing vessel at a second water-vapor flow rate which is less than the first water-vapor flow rate and air is supplied to the processing vessel at a second air flow rate which is less than the first air flow rate wherein the second water-vapor flow rate and second air flow rate are zero.

* * * * *